United States Patent
Hwang et al.

(10) Patent No.: US 11,626,172 B2
(45) Date of Patent: Apr. 11, 2023

(54) SEMICONDUCTOR MEMORY DEVICE AND PROGRAMMING METHOD THEREOF USING A CHANNEL BOOSTING

(71) Applicant: SK hynix Inc., Gyeonggi-do (KR)

(72) Inventors: Sung Hyun Hwang, Gyeonggi-do (KR); Ju Eun Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 1 day.

(21) Appl. No.: 17/365,215

(22) Filed: Jul. 1, 2021

(65) Prior Publication Data
US 2022/0208290 A1    Jun. 30, 2022

(30) Foreign Application Priority Data
Dec. 29, 2020 (KR) ........................ 10-2020-0186196

(51) Int. Cl.
| | | |
|---|---|---|
| *G11C 16/34* | (2006.01) | |
| *G11C 16/10* | (2006.01) | |
| *G11C 16/26* | (2006.01) | |
| *G11C 16/24* | (2006.01) | |
| *G11C 16/08* | (2006.01) | |
| *G11C 16/04* | (2006.01) | |
| *G11C 16/30* | (2006.01) | |

(52) U.S. Cl.
CPC ...... *G11C 16/3459* (2013.01); *G11C 16/0433* (2013.01); *G11C 16/08* (2013.01); *G11C 16/102* (2013.01); *G11C 16/24* (2013.01); *G11C 16/26* (2013.01); *G11C 16/30* (2013.01)

(58) Field of Classification Search
CPC . G11C 16/3459; G11C 16/0433; G11C 16/08; G11C 16/102; G11C 16/24; G11C 16/26; G11C 16/30; G11C 11/5671; G11C 16/10; G11C 16/0483; G11C 8/08; G11C 8/10; G11C 11/416; G11C 11/419; Y02D 10/00

See application file for complete search history.

(56) References Cited

U.S. PATENT DOCUMENTS

| | | | | |
|---|---|---|---|---|
| 9,627,087 | B2 * | 4/2017 | Kato | G11C 16/10 |
| 2015/0063032 | A1 * | 3/2015 | Shimura | G11C 16/0483 |
| | | | | 365/185.17 |
| 2017/0076813 | A1 * | 3/2017 | Kato | G11C 16/3459 |

FOREIGN PATENT DOCUMENTS

| | | |
|---|---|---|
| KR | 10-2012-0017279 A | 2/2012 |
| KR | 10-2012-0121170 A | 11/2012 |

* cited by examiner

*Primary Examiner* — Jay W. Radke
(74) *Attorney, Agent, or Firm* — IP & T Group LLP

(57) ABSTRACT

The present technology relates to a semiconductor memory device and a method of operating the same. The semiconductor memory device includes a memory cell array including a plurality of memory blocks, a peripheral circuit configured to perform a program operation on a selected memory block among the plurality of memory blocks, and control logic configured to control the peripheral circuits to perform a retention acceleration operation including boosting a channel of a plurality of cell strings included in the selected memory block between a program voltage applying operation and a program verify operation during the program operation.

20 Claims, 11 Drawing Sheets

SEMICONDUCTOR MEMORY DEVICE AND PROGRAMMING METHOD THEREOF USING A CHANNEL BOOSTING

CROSS-REFERENCE TO RELATED APPLICATION

The present application claims priority under 35 U.S.C. § 119(a) to Korean patent application number 10-2020-0186196, filed on Dec. 29, 2020, with the Korean Intellectual Property Office, and which is incorporated herein by reference in its entirety.

BACKGROUND

Field of Invention

One or more embodiments described herein relate to a semiconductor memory device and a method of operating a semiconductor memory device.

Description of Related Art

A semiconductor memory device is implemented using a semiconductor material, such as silicon (Si), germanium (Ge), gallium arsenide (GaAs), or indium phosphide (InP). A volatile semiconductor memory device stores data when power is cut off. Examples include a static RAM (SRAM), a dynamic RAM (DRAM), and a synchronous DRAM (SDRAM). A nonvolatile semiconductor memory device maintains stored data even when power is cut off. Examples include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), and a resistive RAM (RRAM), a ferroelectric RAM (FRAM). Examples of a flash memory include a NOR-type and a NAND-type.

SUMMARY

One or more embodiments described herein provide a semiconductor memory device which, for example, may have an improved threshold voltage distribution of memory cells during a program operation.

One or more embodiments described herein provide a method of operating a semiconductor memory device which, for example, may have an improved threshold voltage distribution.

According to an embodiment of the present disclosure, a semiconductor memory device includes a memory cell array including a plurality of memory blocks, a peripheral circuit configured to perform a program operation on a selected memory block among the plurality of memory blocks, and control logic configured to control the peripheral circuit to perform a retention acceleration operation including boosting a channel of a plurality of cell strings included in the selected memory block between a program voltage applying operation and a program verify operation during the program operation.

According to an embodiment of the present disclosure, a semiconductor memory device includes a memory block including memory cells programmed to a plurality of program states, a peripheral circuit configured to perform a program operation including a plurality of program loops for the memory block, and control logic configured to control the peripheral circuits to perform the plurality of program loops. The control logic is configured to control the peripheral circuit to perform a retention acceleration operation during a current program loop when a program state is determined as a program pass, as a result of a program verify operation of a previous program loop among the plurality of program loops.

According to an embodiment of the present disclosure, a method of operating a semiconductor memory device includes performing a program voltage applying operation of applying a program voltage to a selected word line among a plurality of word lines connected to a cell string, the cell string including a plurality of memory cells programmed to a plurality of program states, performing a program verify operation on memory cells connected to the selected word lines, and performing a retention acceleration operation by boosting a channel of the cell string when a program state among the plurality of program states is determined as a program pass as a result of the program verify operation.

This technology may improve a retention deterioration characteristic during a program operation of a semiconductor memory device, thereby improving a phenomenon in which a threshold voltage distribution of memory cells is changed.

DETAILED DESCRIPTION

Structural or functional descriptions of embodiments according to the concept which are disclosed in the present specification or application are illustrated only to describe the embodiments according to the concept of the present disclosure.

The embodiments according to the concept of the present disclosure may be carried out in various forms and are not limited to the embodiments described in the present specification or application.

Hereinafter, embodiments are described in detail with reference to the accompanying drawings, so that those skilled in the art to which the present disclosure pertains may easily carry out the technical spirit of the present disclosure.

Figure 1:
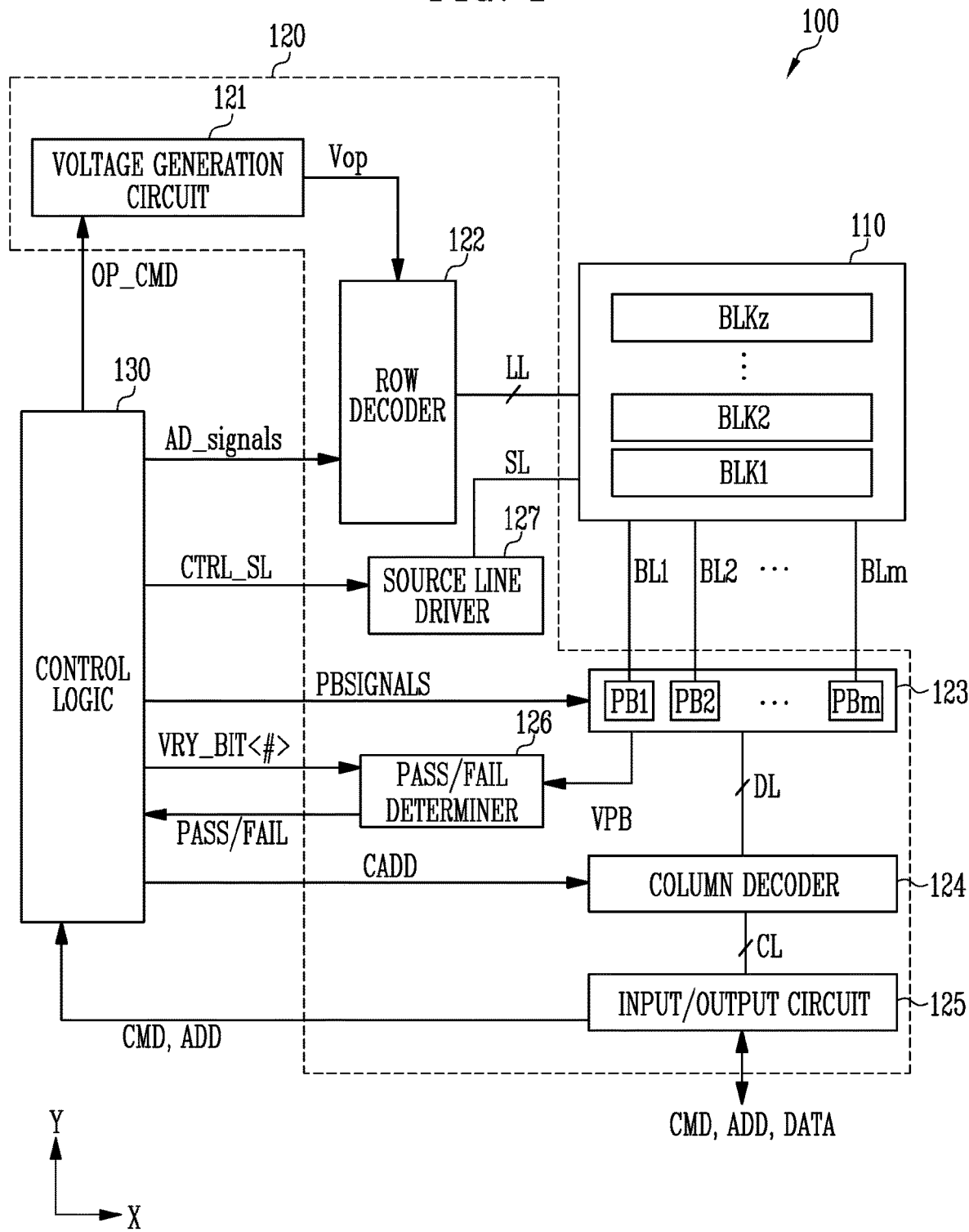
FIG. 1 illustrates an embodiment of a semiconductor memory device.

FIG. 1 is a diagram illustrating an embodiment of a semiconductor memory device 100, which may include a memory cell array 110, a peripheral circuit 120, and control logic 130. The peripheral circuit(s) may perform various operations, e.g., a program operation for storing data in the memory cell array 110, a read operation for outputting the stored data, and an erase operation for erasing the stored data. The control logic 130 may control the peripheral circuit 120, as well as perform other operations.

The memory cell array 110 may include a plurality of memory blocks BLK1 to BLKz. Local lines LL and bit lines BL1 to BLm (m is a positive integer) may be connected to each of the memory blocks BLK1 to BLKz. For example, the local lines LL may include a first select line, a second select line, and a plurality of word lines arranged between the first and second select lines. In addition, the local lines LL may include dummy lines arranged between the first select line and the word lines, and between the second select line and the word lines. The first select line may be a source select line, and the second select line may be a drain select line. For example, the local lines LL may include the word lines, the drain and source select lines.

In one embodiment, the local lines LL may further include dummy lines. For example, the local lines LL may further include pipe lines. The local lines LL may be connected to the memory blocks BLK1 to BLKz, respectively, and the bit lines BL1 to BLM may be commonly connected to the memory blocks BLK1 to BLKz.

The memory blocks BLK1 to BLKz may have a two-dimensional or three-dimensional structure. For example, in a two-dimensional structure, memory cells may be arranged in a direction parallel to the substrate. In a three-dimensional structure, memory cells may be stacked on a substrate in a vertical direction.

The peripheral circuit 120 may be configured to perform program, read, and/or erase operations of a selected memory block under control of control logic 130.

In one embodiment, the peripheral circuit 120 may include a voltage generation circuit 121, a row decoder 122, a page buffer group 123, a column decoder 124, an input/output circuit 125, a pass/fail determiner (a pass/fail check circuit) 126, and a source line driver 127.

The voltage generation circuit 121 may generate various operation voltages Vop used for the program, read, and erase operations in response to an operation signal OP_CMD. In addition, the voltage generation circuit 121 may selectively discharge the local lines LL in response to the operation signal OP_CMD. For example, the voltage generation circuit 121 may generate a program voltage, a verify voltage, and a pass voltage under control of the control logic 130.

The voltage generation circuit 121 may generate a first set voltage to be applied to unselected word lines and a second set voltage to be applied to a selected word line during a retention acceleration operation in the program operation. The second set voltage may be a voltage of a potential different from (e.g., lower than) that of the first set voltage. For example, the first set voltage may be a positive voltage having a high potential and the second set voltage may be a voltage of 0V.

The row decoder 122 may transfer the operation voltages Vop to the local lines LL connected to the selected memory block in response to row decoder control signals AD_signals. For example, during the program operation, the row decoder 122 may apply the program voltage generated by the voltage generation circuit 121 to a selected word line among selected local lines LL of the selected memory block in response to the row decoder control signals AD_signals, and may apply the pass voltage generated by the voltage generation circuit 121 to unselected word lines.

The row decoder 122 may apply the first set voltage generated by the voltage generation circuit 121 to the unselected word lines of the selected memory block and may apply the second set voltage generated by the voltage generation circuit 121 to the selected word line during the retention acceleration operation in the program operation. In addition, the row decoder 122 may turn off drain select transistors and source select transistors of the selected memory block, by applying a turn-off voltage to the drain select lines and the source select lines of the selected memory block during the retention acceleration operation in the program operation.

The page buffer group 123 may include a plurality of page buffers PB1 to PBm connected to the bit lines BL1 to BLm. The page buffers PB1 to PBm may operate in response to page buffer control signals PBSIGNALS. For example, the page buffers PB1 to PBm temporarily store data to be programmed during the program operation and adjust a potential level of the bit lines BL1 to BLm based on the temporarily stored data to be programmed. In addition, the page buffers PB1 to PBm may sense a voltage or a current of the bit lines BL1 to BLm during the read or program verify operation.

The column decoder 124 may transfer data between the input/output circuit 125 and the page buffer group 123 in response to a column address CADD. For example, the column decoder 124 may exchange data with the page buffers PB1 to PBm through the data lines DL or may exchange data with the input/output circuit 125 through column lines CL.

The input/output circuit 125 may transfer a command CMD and an address ADD (e.g., received from an external source) to the control logic 130 or may exchange data DATA with the column decoder 124.

During the read operation or the program verify operation, the pass/fail determiner 126 may generate a reference current in response to a permission bit VRY_BIT<#>, compare a sensing voltage VPB received from the page buffer group 123 with a reference voltage generated by the reference current, and output a pass signal PASS or a fail signal FAIL. The sensing voltage VPB may be controlled, for example, based on the number of memory cells determined as a pass during the program verify operation.

The source line driver 127 may be connected to a memory cell in the memory cell array 110 through the source line SL and may control a voltage applied to the source line SL. The source line driver 127 may receive a source line control signal CTRL_SL from the control logic 130 and control the voltage applied to the source line SL based on the source line control signal CTRL_SL.

In response to the command CMD and the address ADD, the control logic 130 may control the peripheral circuit 120 by outputting the operation signal OP_CMD, the row decoder control signals AD_signals, the page buffer control signals PBSIGNALS, and the permission bit VRY_BIT<#>. The control logic 130 may control the peripheral circuit 120 to sequentially perform a plurality of program loops, during the program operation on a selected page of the selected memory block, in order to program the memory cells in the selected page to one or more program states.

For example, each of the program loops may include a program voltage applying operation and a program verify operation sequentially performed. Some of the program loops may include a retention acceleration operation. For example, when it is determined as a program pass as a result of the program verify operation, the retention acceleration operation may be included in a corresponding program loop, or the retention acceleration operation may be included in a next program loop. When, for example, it is determined as a program pass as a result of the program verify operation in the corresponding program loop, the retention acceleration operation may be performed immediately after completion of the program verify operation, or the retention acceleration operation may be performed before the program voltage applying operation or the program verify operation of the next program loop.

During the program operation of the memory cells, charges may be trapped in a charge storage layer of the memory cells. Some of the trapped charges may be trapped in an unstable state. The charges trapped in the unstable state may be detrapped in the charge storage layer within a predetermined time after the program operation is completed. This may cause a reduction in the threshold voltage of (e.g., one or more transistors in) the memory cells.

In one embodiment, a retention acceleration operation may be performed if a program state corresponding to one of the plurality of program states is determined as a program pass as a result of a program verify operation during a program operation. During the retention acceleration operation, the control logic 130 controls the peripheral circuit 120 to self-boost channels of one or more strings in the selected memory block.

For example, in a state in which the source select transistors and the drain select transistors of the selected memory block are turned off, a potential of the channels of the strings in the selected memory block is increased by applying the first set voltage of the high potential to the unselected word lines. At this time, charges trapped in an unstable state may be removed from among charges trapped in the memory cells connected to the selected word line. This may be accomplished by applying the second set voltage of 0 V to the selected word line. Accordingly, a phenomenon, in which a retention characteristic and a threshold voltage distribution of the memory cells are changed, may be improved.

Figure 2:
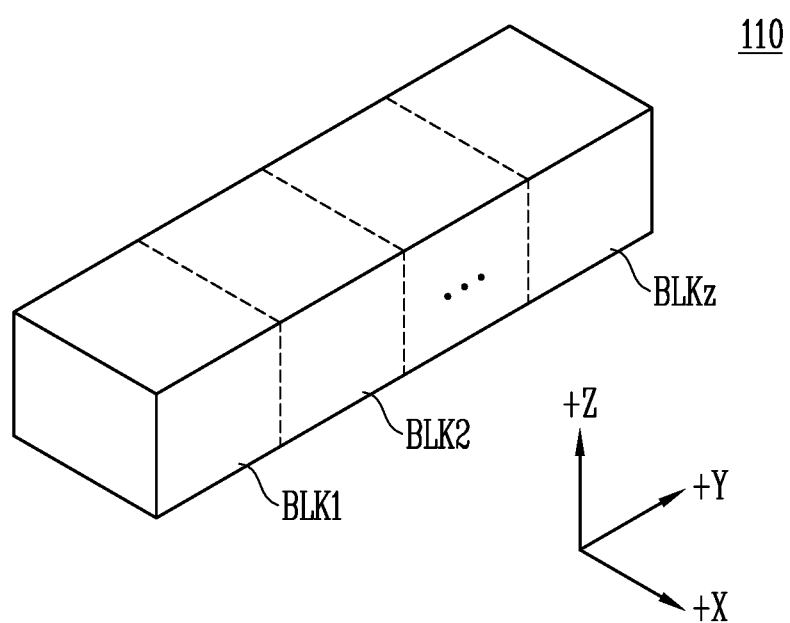
FIG. 2 illustrates an embodiment of a memory cell array.

FIG. 2 is a diagram illustrating an embodiment of the memory cell array 110 of FIG. 1.

Referring to FIG. 2, the memory cell array 110 includes a plurality of memory blocks BLK1 to BLKz. Each memory block may have a three-dimensional structure and may include a plurality of memory cells stacked on a substrate. The memory cells may be arranged along a +X direction, a +Y direction, and a +Z direction. Examples of the structure of each memory block are described with reference to FIGS. 3 to 5.

Figure 3:
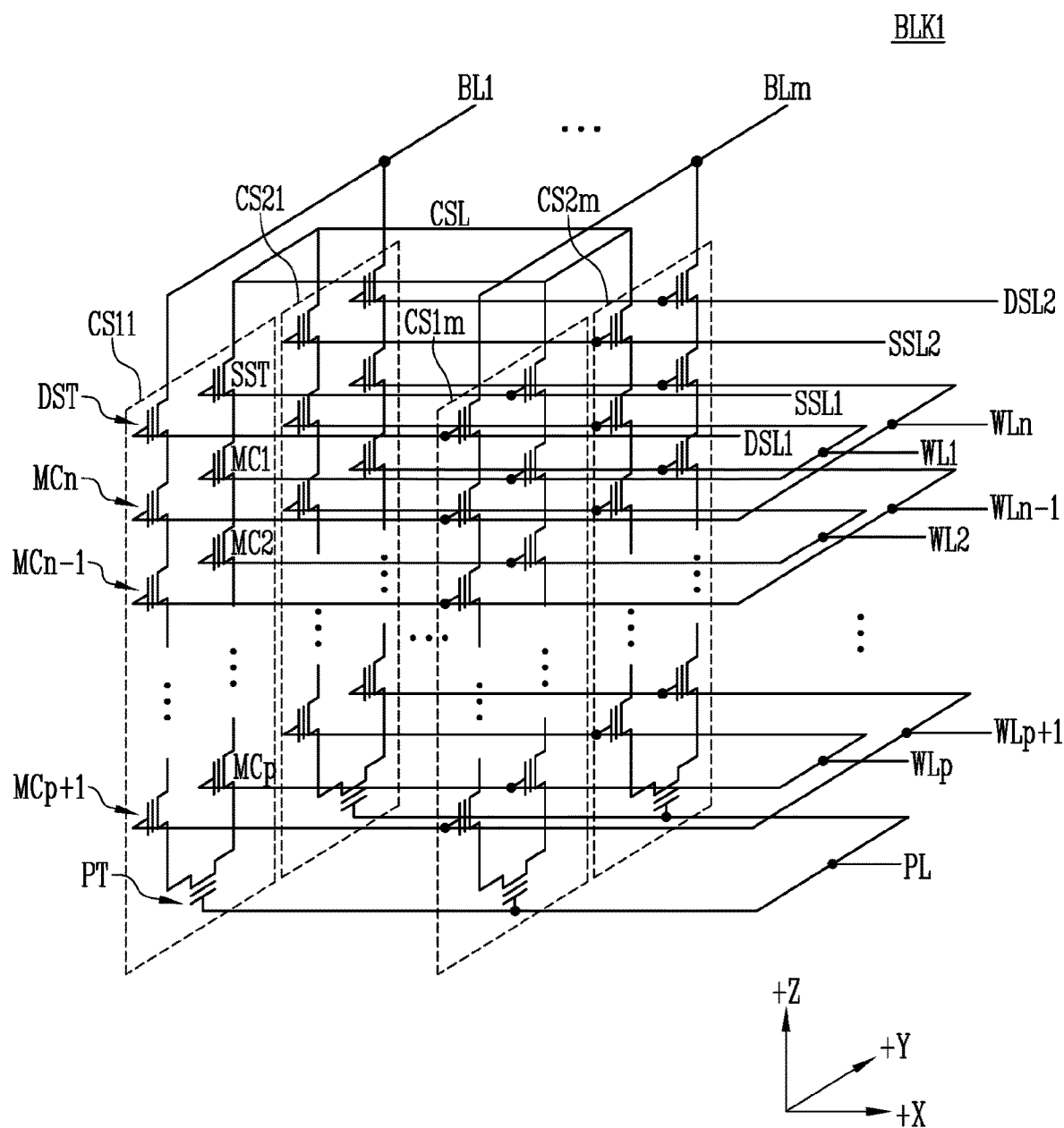
FIG. 3 illustrates an embodiment of a memory block.

FIG. 3 is a circuit diagram illustrating an embodiment of a memory block BLK1, which, for example, may be representative of memory blocks BLK1 to BLKz of FIG. 2.

Referring to FIG. 3, the memory block BLK1 includes a plurality of cell strings CS11 to CS1*m* and CS21 to CS2*m*. In an embodiment, each of the cell strings CS11 to CS1*m* and CS21 to CS2*m* may be formed in a predetermined shape, e.g., a 'U' shape or another shape. In memory block BLK1, m cell strings are arranged in a row direction (that is, the +X direction). In FIG. 3, two cell strings are arranged in a column direction (e.g., the +Y direction). However, this is for convenience of description and it may be understood that three or more cell strings may be arranged in the column direction.

Each of the cell strings CS11 to CS1*m* and CS21 to CS2*m* may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, or the blocking insulating film may be provided in each cell string.

The source select transistor SST of each cell string is connected between a common source line CSL and the memory cells MC1 to MCp. In an embodiment, the source select transistors of the cell strings arranged in the same row are connected to a source select line extending in the row direction. The source select transistors of the cell strings arranged in different rows may be connected to different source select lines. In FIG. 3, the source select transistors of the cell strings CS11 to CS1*m* of a first row are connected to a first source select line SSL1. The source select transistors of the cell strings CS21 to CS2*m* of a second row are connected to a second source select line SSL2.

In one embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST. The first to n-th memory cells MC1 to MCn may include first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting one of the drain select lines DSL1 or DSL2. One page of the selected cell strings may be selected by selecting one of the word lines WL1 to WLn.

In one embodiment, even bit lines and odd bit lines may be provided instead of the first to m-th bit lines BL1 to BLm.

In addition, even-numbered cell strings among the cell strings CS11 to CS1*m* or CS21 to SC2*m* arranged in the row direction may be connected to the even bit lines, respectively, and odd-numbered cell strings among the cell strings CS11 to CS1*m* or CS21 to CS2*m* arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. In one embodiment, at least one dummy memory cell is provided to reduce an electric field between the drain select transistor DST and the memory cells MCp+1 to MCn. As more dummy memory cells are provided, reliability of operation for the memory block BLK1 is improved but the size of the memory block BLK1 increases. As less dummy memory cells are provided, the size of the memory block BLK1 may be reduced but reliability of the operation for the memory block BLK1 may be reduced.

In order to efficiently control at least one dummy memory cell, each of the dummy memory cells may have a threshold voltage. Before or after an erase operation for the memory block BLK1, program operations for all or a part of the dummy memory cells may be performed. When the erase operation is performed after the program operation is performed, the dummy memory cells may have their threshold voltages set by controlling a voltage applied to dummy word lines connected to the respective dummy memory cells.

Figure 4:
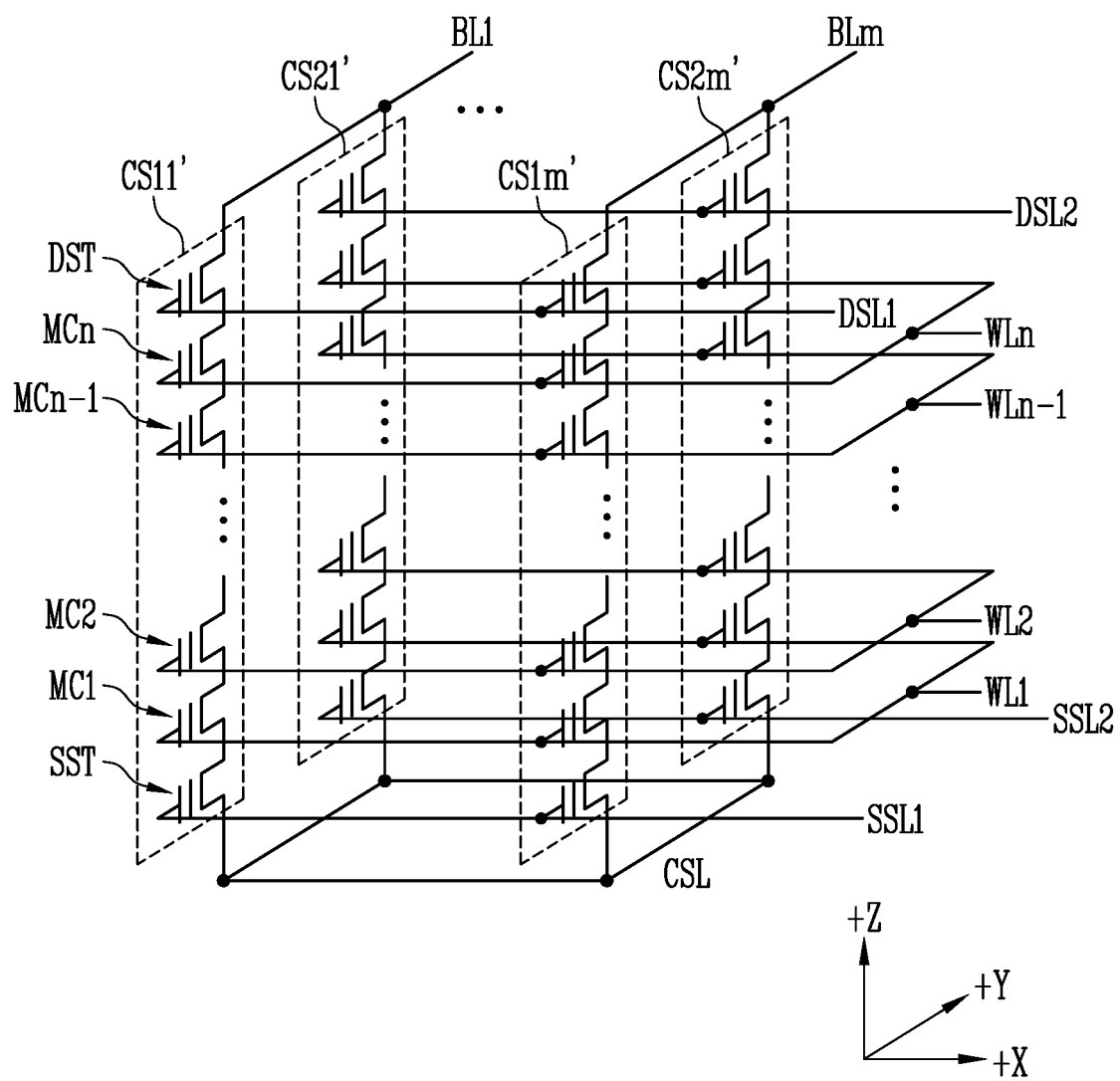
FIG. 4 illustrates an embodiment of a memory block.

FIG. 4 is a circuit diagram illustrating an embodiment of a memory block BLK2, which, for example, may be representative of memory blocks BLK1 to BLKz of FIG. 2.

Referring to FIG. 4, the memory block BLK2 includes a plurality of cell strings CS11' to CS1*m*' and CS21' to CS2*m*'. Each of the cell strings CS11' to CS1*m*' and CS21' to CS2*m*' extends along a +Z direction. Each of the cell strings CS11' to CS1*m*' and CS21' to CS2*m*' includes at least one source select transistor SST, first to n-th memory cells MC1 to MCn, and at least one drain select transistor DST stacked on a substrate under the memory block BLK2.

The source select transistor SST of each cell string is connected between a common source line CSL and memory cells MC1 to MCn. The source select transistors of the cell strings arranged in the same row are connected to the same source select line. The source select transistors of the cell strings CS11' to CS1*m*' arranged in a first row are connected to a first source select line SSL1. The source select transistors of the cell strings CS21' to CS2*m*' arranged in a second row are connected to a second source select line SSL2. In one embodiment, the source select transistors of the cell strings CS11' to CS1*m*' and CS21' to CS2*m*' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1*m*' of a first row are connected to a first drain select line DSL1. The drain select transistors of the cell strings CS21' to CS2*m*' of a second row are connected to a second drain select line DSL2.

As a result, the memory block BLK2 of FIG. 4 may have an equivalent circuit similar to that of memory block BLK1 of FIG. 3, except that pipe transistor PT is excluded from each cell string.

In one embodiment, even bit lines and odd bit lines may be provided instead of the first to m-th bit lines BL1 to BLm. In addition, even-numbered cell strings among the cell strings CS11' to CS1*m*' or CS21' to CS2*m*' arranged in the row direction may be connected to even bit lines, respectively, and odd-numbered cell strings among the cell strings CS11' to CS1*m*' or CS21' to CS2*m*' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. In one embodiment, at least one dummy memory cell is provided to reduce an electric field between the drain select transistor DST and the memory cells MC1 to MCn. As more dummy memory cells are provided, reliability of operation for the memory block BLK2 is improved but the size of the memory block BLK2 increases. As less dummy memory cells are provided, the size of the memory block BLK2 may be reduced but reliability of operation for the memory block BLK2 may be reduced.

In order to efficiently control at least one dummy memory cell, each of the dummy memory cells may have a threshold voltage. Before or after an erase operation for the memory block BLK2, program operations for all or a part of the dummy memory cells may be performed. When the erase operation is performed after the program operation is performed, the dummy memory cells may have the threshold voltage set by controlling a voltage applied to the dummy word lines connected to the respective dummy memory cells.

Figure 5:
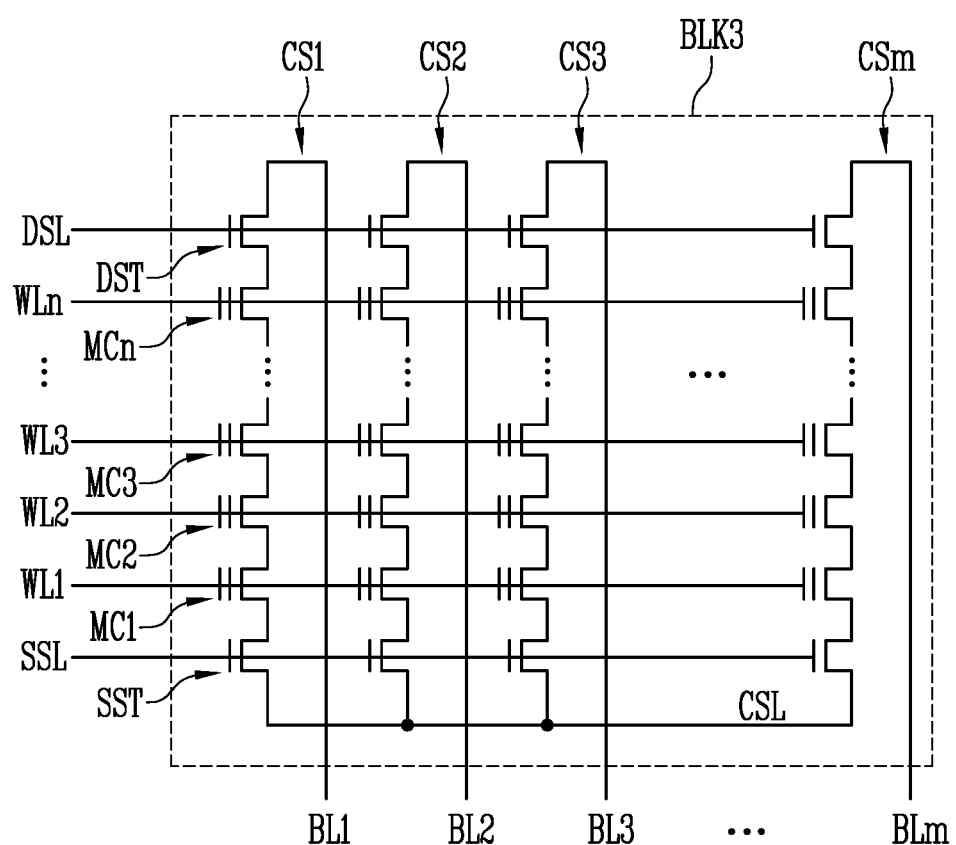
FIG. 5 illustrates an embodiment of a memory block.

FIG. 5 is a circuit diagram illustrating an embodiment of a memory block BLK3, which, for example, may be representative of memory blocks BLK1 to BLKz in the memory cell array 110 of FIG. 1.

Referring to FIG. 5, the memory block BLK3 may include a plurality of cell strings CS1 to CSm connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn. The first to n-th memory cells MC1 to MCn of each cell string are connected between the source select transistor SST and the drain select transistor DST. The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, respectively, and odd-numbered cell strings may be connected to odd bit lines, respectively.

As described above, the memory cells connected to one word line may configure one physical page. In the example of FIG. 5, among the memory cells belonging to the memory block BLK3, m memory cells connected to any one of the plurality of word lines WL1 to WLn configure one physical page.

The memory cell array 110 of the semiconductor memory device 100 may be configured in a three-dimensional structure (e.g., as shown in FIGS. 3 and 4) or a two-dimensional structure (e.g., as shown in FIG. 5).

Figure 6:
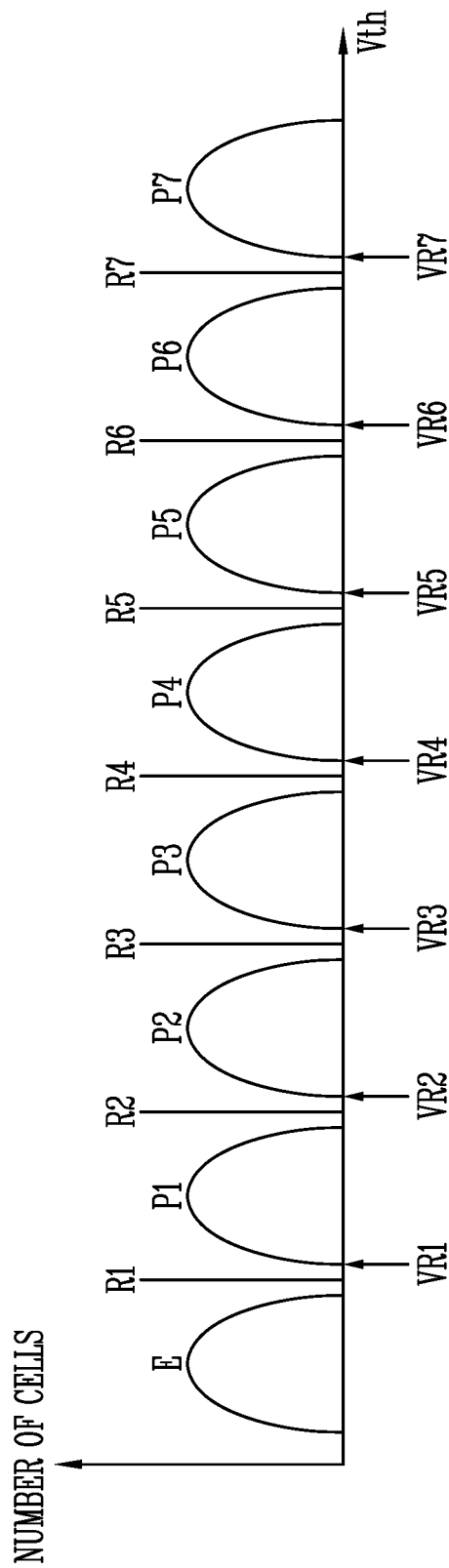
FIG. 6 illustrates an example of program states of a triple-level cell.

FIG. 6 is a graph illustrating an example of program states of a triple-level cell (TLC). Referring to FIG. 6, in this example the triple-level cell has threshold voltage states corresponding to one erase state E and seven program states P1 to P7, respectively. The erase state E and the first to seventh program states P1 to P7 have a corresponding bit code, e.g., different bit codes may be assigned to respective ones of the erase state E and the first to seventh program states P1 to P7.

Each of the threshold voltage states may be classified based on first to seventh read voltages R1 to R7. In addition, first to seventh verify voltages VR1 to VR7 may be used to determine whether a program of memory cells corresponding to each program state is completed.

For example, the second verify voltage VR2 is applied to the word line to verify memory cells corresponding to the second program state P2, among the memory cells in the selected physical page. At this time, the page buffer PB1 shown in FIG. 1 may sense a current of the bit line BL1 to distinguish whether a target memory cell connected to the bit line BL1 is in a program incomplete state or a program complete state.

An example of target program states of the TLC are shown in FIG. 6, but one or more different target program states may be used in other embodiments. In one embodiment, the memory cells in the semiconductor memory device may be a multi-level cells (MLCs). In one embodiment, the memory cells in the semiconductor memory device may be quad-level cells (QLCs).

Figure 7:
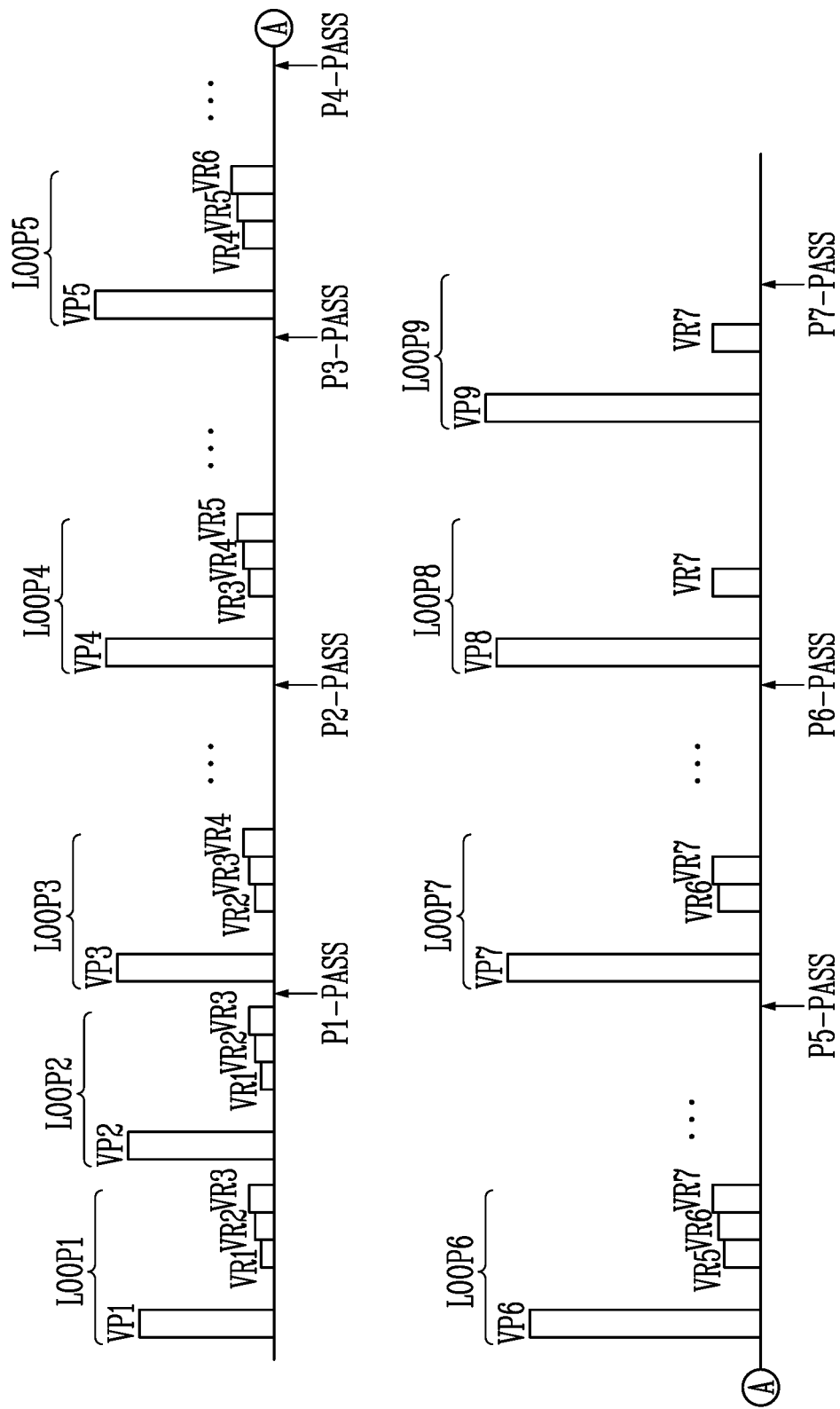
FIG. 7 illustrates an embodiment of a program operation.

FIG. 7 is a diagram illustrating an embodiment of a program operation, where programming the memory cells in a TLC method is described as an example. The program operation may be described with reference to FIGS. 6 and 7 as follows.

Referring to FIGS. 6 and 7, an embodiment is shown in which the program operation for the first to seventh program states P1 to P7 is performed. In the program operation, a plurality of program loops LOOP1 to LOOP9 corresponding to the first to seventh program states P1 to P7 are sequentially performed. For example, program loops LOOP1 and LOOP2 correspond to the first program state P1, and program loop LOOP3 corresponds to the second program state P2. In addition, program loop LOOP4 may correspond to the third program state P3, program loop LOOP5 may correspond to the fourth program state P4, program loop LOOP6 may correspond to the fifth program state P5, program loop LOOP7 may correspond to the sixth program state P6, and program loops LOOP8 and LOOP9 may correspond to the seventh program state P7.

Each of the program loops LOOP1 to LOOP9 may include a program voltage applying operation and at least one program verify operation. In addition, some program loops may include a program voltage applying operation, at least one program verify operation, and a retention acceleration operation. For example, when a program state is determined as a program pass as a result of the program verify operation, the retention acceleration operation may be performed in a corresponding program loop or the retention acceleration operation may be performed in a next program loop.

As a result of the program verify operation in each program loop, a program pass may be determined when the program of the memory cells to be programmed to a program state corresponding to the program loop is completed by more than a set number. For example, when it is determined that the program operation for the first program state P1 is passed as a result of the program verify operation of the program loop LOOP2 (P1-PASS), the retention acceleration operation may be performed after the program verify operation is completed in the corresponding program loop LOOP2, or the retention acceleration operation may be performed before the program voltage applying operation or the program verify operation of the next program loop LOOP3.

Figure 8:
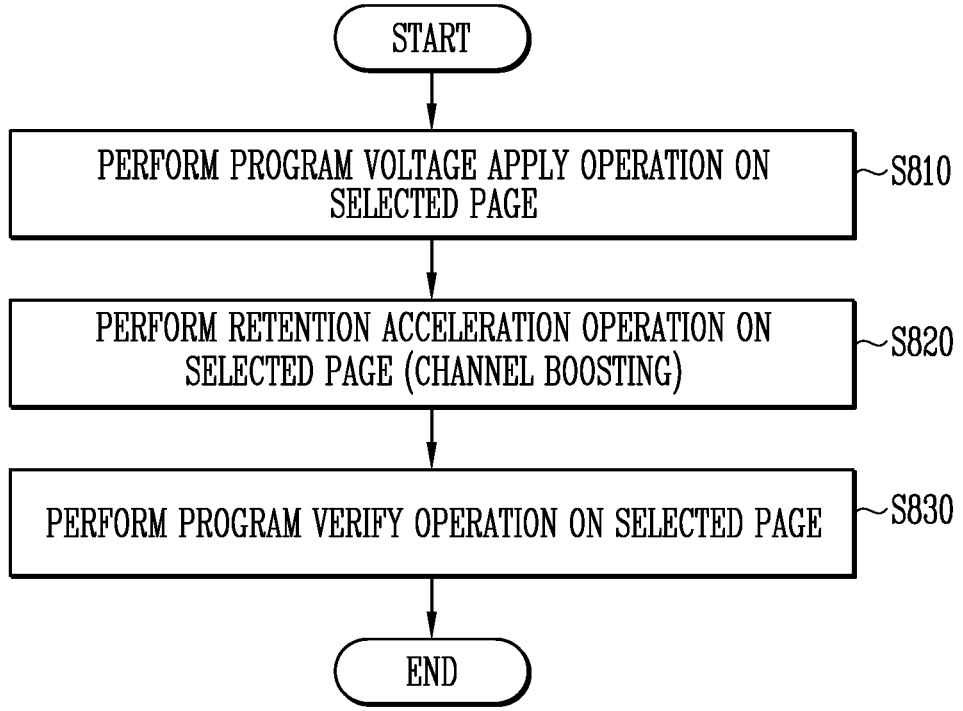
FIGS. 8 and 9 illustrate embodiments of a program operation.
Figure 9:
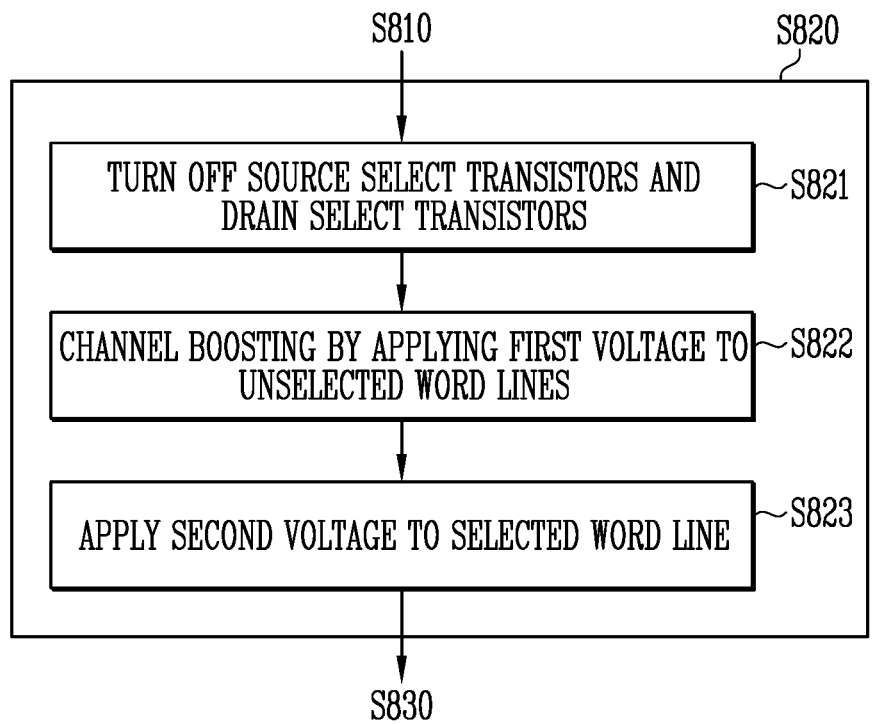
Figure 10:
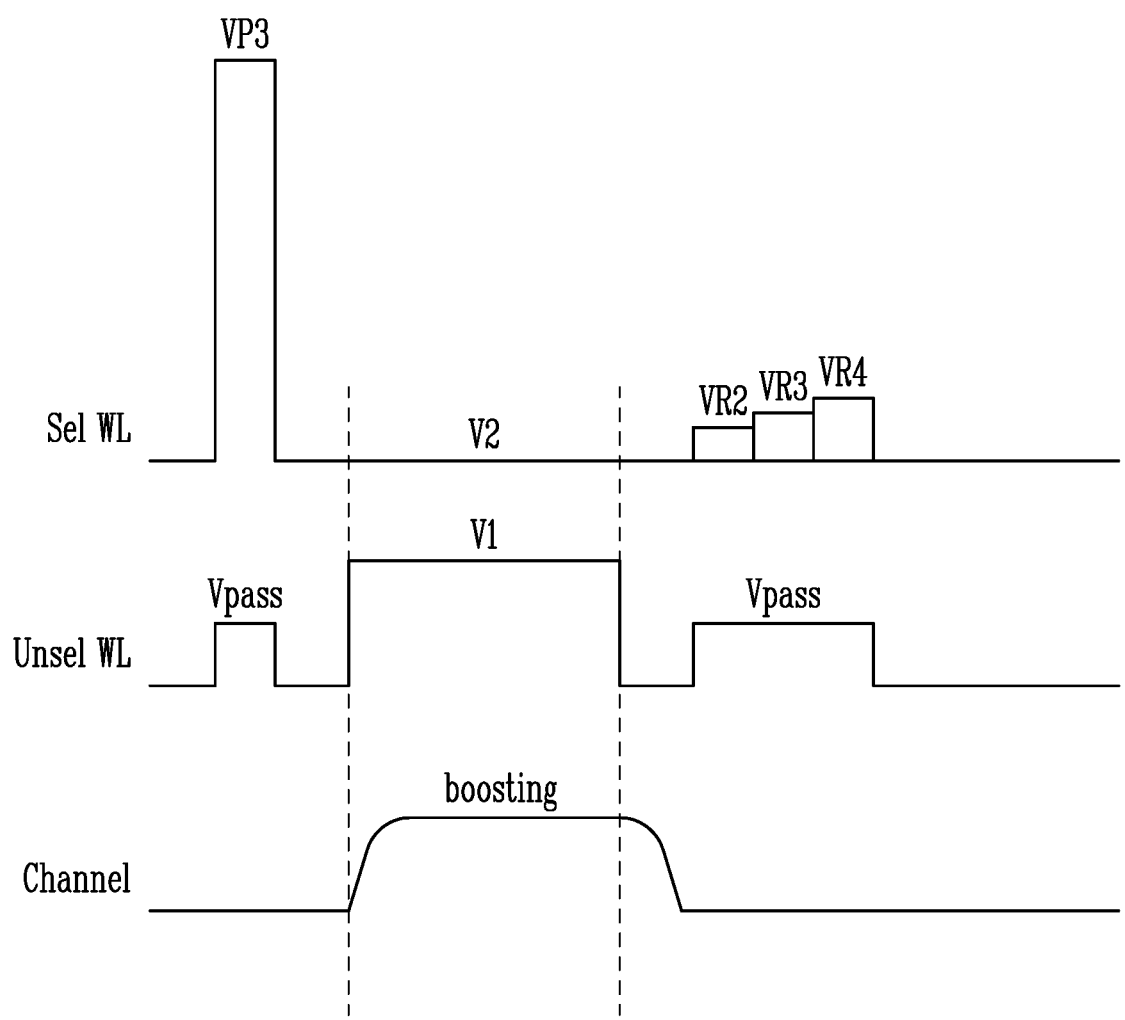
FIG. 10 illustrates an embodiment of a program loop.

FIGS. 8 and 9 are flowcharts illustrating embodiments of a program operation, and FIG. 10 illustrates an embodiment of one program loop among the program loops of FIG. 7. For example, an embodiment of a program operation method may be described with reference to FIGS. 1, 5, and 8 to 10 as follows.

Program loop LOOP3 among the program loops LOOP1 to LOOP9 of FIG. 7 is described as an example. For example, a case is described where program loop LOOP3 is performed after it is determined as a program pass P1-PASS, based on a result of the program verify operation for the first program state P1 in the previous program loop LOOP2.

The page buffers PB1 to PBm temporarily store data to be programmed during the program operation and adjust the potential levels of the bit lines BL1 to BLm based on the temporarily stored data to be programmed. For example, bit lines on which the program operation is to be performed are controlled to a program permission voltage level, and bit lines on which the program operation is not to be performed are controlled to a program inhibition voltage level.

In S810, control logic 130 controls peripheral circuit 120 to perform a program voltage applying operation on a selected page of a selected memory block. For example, voltage generation circuit 121 generates a program voltage VP3 and pass voltage Vpass in response to the operation signal OP_CMD. Row decoder 122 applies the program voltage VP3 to the selected word line (for example, WL1) of the selected memory block (for example, BLK3) and applies the pass voltage Vpass to remaining ones of the unselected word lines (for example, WL2 to WLn). Therefore, charges are trapped in the charge storage layer of the memory cells in which the corresponding bit line is controlled to the program permission voltage level, among the memory cells MC1 in the selected page.

In S820, control logic 130 controls the peripheral circuit 120 to perform the retention acceleration operation on the selected page of the selected memory block using the channel boosting operation. An embodiment is described as follows.

In S821, row decoder 122 turns off the drain select transistors DST and the source select transistors SST of the selected memory block BLK3, by applying a turn-off voltage to the drain select line DSL and the source select line SSL of the selected memory block BLK3 during the retention acceleration operation. Accordingly, the channel of the cell strings CS1 to CSm in the selected memory block BLK3 are in the floating state.

In S822, the voltage generation circuit 121 generates and outputs a first set voltage V1 to be applied to the unselected word lines WL2 to WLn and a second set voltage V2 to be applied to the selected word line WL1. The row decoder 122 applies the first set voltage V1 to the unselected word lines WL2 to WLn of the selected memory block BLK3. Accordingly, a phenomenon may occur in which a potential level of the channel of the cell strings CS1 to CSm in the selected memory block BLK3 is increased, as a result of a coupling phenomenon by the first set voltage V1 of a high potential applied to the unselected word lines WL2 to WLn.

The channel potential of the cell strings CS1 to CSm in the selected memory block BLK3 is increased by a positive set voltage Vposi applied to the source line SL. For example, the channel potential of the cell strings CS1 to CSm in the selected memory block BLK3 is increased by turning on the source select transistors SST of the selected memory block BLK3. In one embodiment, the channel potential of the cell strings CS1 to CSm may be increased in a gate induced drain leakage (GIDL) method, for example, by applying a voltage of 0V to the gates of the source select transistors SST of the selected memory block BLK3.

In S823, the second set voltage V2 is applied to the selected word line WL1 corresponding to the selected page of the selected memory block BLK3. Accordingly, the charges trapped in the unstable state in the memory cells MC1 in the selected page may be detrapped by the channel boosted channel potential and the second set voltage V2 applied to the word line WL1.

In S830, control logic 130 controls the peripheral circuit 120 to perform the program verify operation on the selected page of the selected memory block. For example, the voltage generation circuit 121 generates the verify voltage VR2 and the pass voltage Vpass in response to the operation signal OP_CMD. The row decoder 122 applies the verify voltage VR2 to the selected word line (for example, WL1) of the selected memory block (for example, BLK3) and applies the pass voltage Vpass to the remaining unselected word lines (for example, WL2 to WLn). The page buffers PB1 to PBm sense the voltage or the current of the bit lines BL1 to BLm to perform the verify operation corresponding to the second program state P2.

Thereafter, the voltage generation circuit 121 generates the verify voltage VR3 and the pass voltage Vpass in response to the operation signal OP_CMD, and the row decoder 122 applies the verify voltage VR3 to the selected word line (for example, WL1) of the selected memory block (for example, BLK3) and applies the pass voltage to the remaining unselected word lines (for example, WL2 to WLn). The page buffers PB1 to PBm sense the voltage or the current of the bit lines BL1 to BLm to perform the verify operation corresponding to the third program state P3.

Thereafter, voltage generation circuit 121 generates the verify voltage VR4 and the pass voltage Vpass, and the row decoder 122 applies the verify voltage VR4 to the selected word line (for example, WL1) of the selected memory block (for example, BLK3) and applies the pass voltage Vpass to the remaining unselected word lines (for example, WL2 to WLn). The page buffers PB1 to PBm sense the voltage or the current of the bit lines BL1 to BLm to perform the verify operation corresponding to the fourth program state P4.

In the above-described embodiment, an example is described in which a retention acceleration operation is performed after the program voltage applying operation is performed in the current program loop, when a program state is determined as a pass based on the program verify operation in the previous program loop. However, in one embodiment, the retention acceleration operation may be performed, in the current program loop, after the program verify operation, in the current program loop, is completed, or the retention acceleration operation may be performed, in the current program loop, before the program voltage applying operation is performed in the current program loop. For example, after a program state is determined as a program pass by a program verify operation of the current program loop, the retention acceleration operation may be performed in the current loop immediately after the program verify operation of the current program loop or in the next program loop.

In the program verify operation performed after the retention acceleration operation is performed, the verify voltage may be lowered and applied. Since a threshold voltage of the program-passed memory cells may be lowered by the retention acceleration operation, a threshold voltage distribution of the memory cells may be further improved by lowering the verify voltage by the lowered threshold voltage during the next program verify operation.

In the above description, an example is described in which the retention acceleration operation is performed when it is determined as a pass based on a program verify operation for the first program state P1. In other embodiments, the retention acceleration operation may be performed in the current program loop or a next program loop when it is determined as a pass based on a program verify operation for each of the second to sixth program states P2 to P6.

Figure 11:
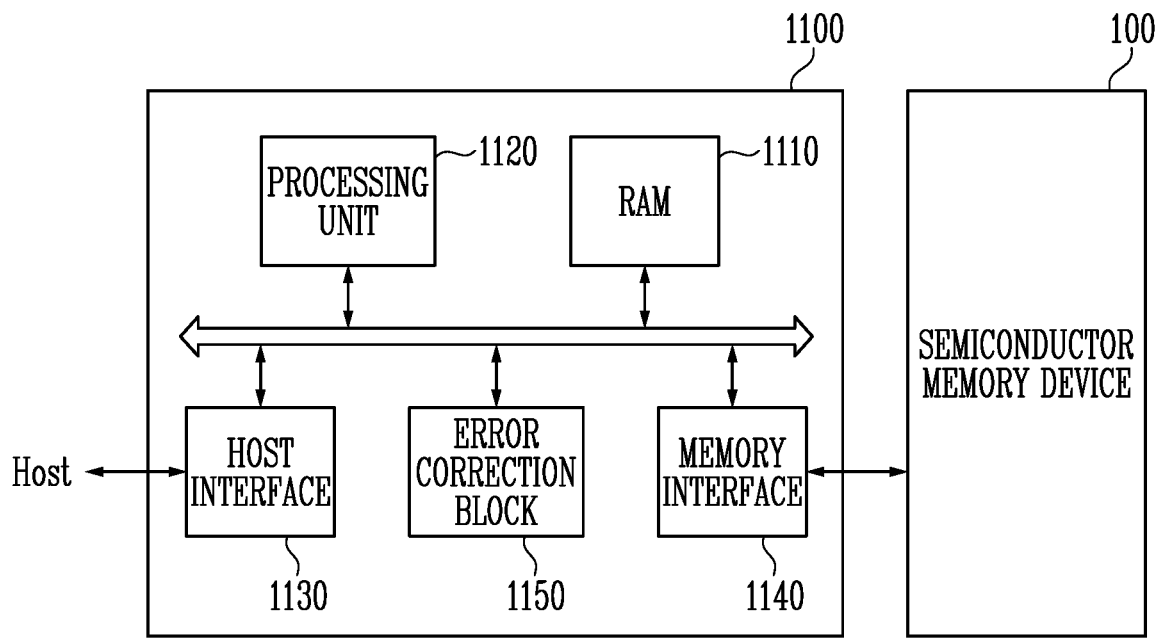
FIG. 11 illustrates an embodiment of a memory system.

FIG. 11 is a block diagram illustrating an embodiment of a memory system 1000 including a semiconductor memory device in accordance with any of the embodiments herein.

Referring to FIG. 11, the memory system 1000 includes the semiconductor memory device 100 and a controller 1100. The semiconductor memory device 100 may be, for example, the semiconductor memory device described with reference to FIG. 1.

The controller 1100 is connected to a Host and the semiconductor memory device 100. The controller 1100 is configured to access the semiconductor memory device 100 in response to a request from the Host. For example, the controller 1100 is configured to control read, write, erase, and background operations of the semiconductor memory device 100. The controller 1100 is configured to serve as an interface between the semiconductor memory device 100 and the Host. The controller 1100 is configured to drive instructions (e.g., firmware) for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the Host, and a buffer memory between the semiconductor memory device 100 and Host. The processing unit 1120 controls overall operation of the controller 1100. In addition, the controller 1100 may temporarily store program data provided from the Host during the program operation.

The host interface 1130 includes a protocol for performing data exchange between the Host and the controller 1100. As an exemplary embodiment, the controller 1100 is configured to communicate with the Host through at least one of various interface protocols. Examples include a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 includes a NAND interface or a NOR interface.

The error correction block 1150 is configured to detect and correct an error of data received from the semiconductor memory device 100 using an error correcting code (ECC). The processing unit 1120 may control the semiconductor memory device 100 to adjust a read voltage and perform re-read according to an error detection result of the error correction block 1150. As an exemplary embodiment, the error correction block may be a component of the controller 1100.

The controller 1100 and the semiconductor memory device 100 may be integrated into one semiconductor device. As an exemplary embodiment, the controller 1100 and semiconductor memory device 100 may be integrated into one semiconductor device to form a memory card. Examples of the memory card include a PC card (personal computer memory card international association (PCM-CIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 may be dramatically improved.

In one example, the memory system 1000 is provided as one of various components of an electronic device. Examples of the electronic device include a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, and one of various components configuring a computing system.

As an exemplary embodiment, the semiconductor memory device 100 or the memory system 1000 may be mounted as a package of various types. Examples include package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), and a wafer-level processed stack package (WSP).

Figure 12:
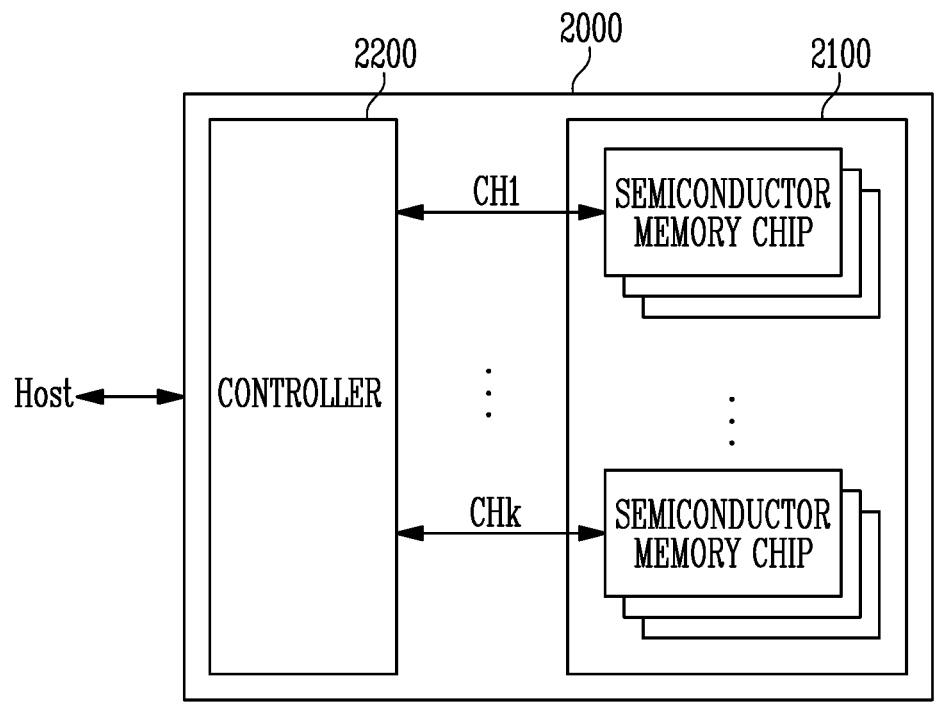
FIG. 12 illustrates an application example of a memory system.

FIG. 12 is a block diagram illustrating an application example of the memory system 2000 of FIG. 11.

Referring to FIG. 12, the memory system 2000 includes a semiconductor memory device 2100 and a controller 2200. The semiconductor memory device 2100 includes a plurality of semiconductor memory chips, which may be divided into a plurality of groups.

In FIG. 12, the plurality of groups communicate with the controller 2200 through first to k-th channels CH1 to CHk, respectively. Each semiconductor memory chip is configured and is operated similarly to that of the semiconductor memory device 100 described with reference to FIG. 1.

Each group is configured to communicate with the controller 2200 through one common channel. The controller 2200 may be configured similarly to the controller 1100 described with reference to FIG. 11 and may be configured to control the plurality of memory chips of the semiconductor memory device 2100 through the plurality of channels CH1 to CHk.

Figure 13:
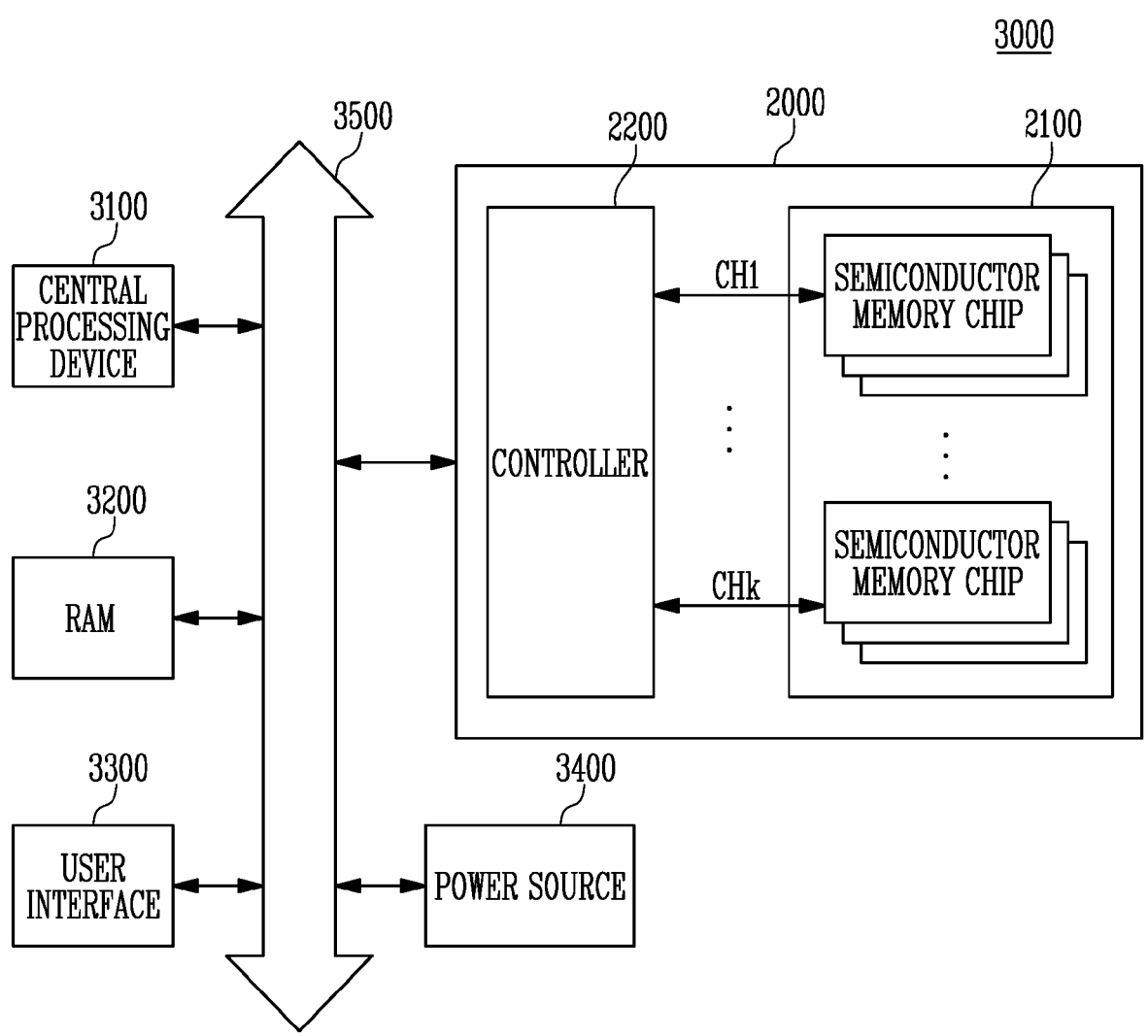
FIG. 13 illustrates an embodiment of a computing system.

FIG. 13 is a block diagram illustrating an embodiment of a computing system 3000 including a memory system, which, for example, may be the memory system of FIG. 12.

The computing system 3000 includes a central processing device 3100, a random access memory (RAM) 3200, a user interface 3300, a power source 3400, a system bus 3500, and the memory system 2000. The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 13, the semiconductor memory device 2100 is connected to the system bus 3500 through the controller 2200. However, in an embodiment, the semiconductor memory device 2100 may be configured to be directly connected to the system bus 3500. At this time, operations of the controller 2200 may be controlled or performed by the central processing device 3100 and RAM 3200.

In FIG. 13, the memory system 2000 is described with reference to FIG. 12. However, in one embodiment, the memory system 2000 may be replaced with memory system 1000 described with reference to FIG. 11. In an exemplary embodiment, the computing system 3000 may be configured to include both of the memory systems 1000 and 2000 described with reference to FIGS. 11 and 12.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, units, multiplexers, generators, logic, interfaces, decoders, determiners, drivers, blocks, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The embodiments of the present disclosure disclosed in the present specification and drawings are merely specific examples for easily describing the technical content of the present disclosure and facilitating understanding of the present disclosure and do not limit the scope of the present disclosure. It is apparent to a person skilled in the art to which the present disclosure pertains that other modifications based on the technical spirit of the present disclosure may be carried out in addition to the embodiments disclosed herein.

What is claimed is:

1. A semiconductor memory device, comprising:
a memory cell array including a plurality of memory blocks;
a peripheral circuit configured to perform a program operation including a plurality of program loops on a selected memory block among the plurality of memory blocks; and
control logic configured to:
determine whether to perform a retention acceleration operation for a current program loop based on a result of a program verify operation of a previous program loop; and
control the peripheral circuit to perform the retention acceleration operation including boosting a channel of a plurality of cell strings in the selected memory block between a program voltage applying operation and a program verify operation of the current program loop.

2. The semiconductor memory device of claim 1, wherein the peripheral circuit includes:
a voltage generation circuit configured to generate, during the retention acceleration operation, a first set voltage to be applied to unselected word lines of the selected memory block, and a second set voltage to be applied to a selected word line of the selected memory block;
a row decoder configured to apply the first set voltage and the second set voltage to the unselected word lines and the selected word line of the selected memory block, respectively; and
a page buffer group configured to control a potential of bit lines of the selected memory block or sense the potential or a current amount of the bit lines.

3. The semiconductor memory device of claim 2, wherein the row decoder is configured to apply a turn-off voltage to a source select line and a drain select line of the selected memory block, during the retention acceleration operation.

4. The semiconductor memory device of claim 3, wherein the row decoder is configured to control the channel of the plurality of cell strings in the selected memory block to have a floating state during the retention acceleration operation.

5. The semiconductor memory device of claim 4, wherein
the channel of the plurality of cell strings is boosted by the first set voltage, and
the first set voltage is higher than the second set voltage.

6. The semiconductor memory device of claim 1, wherein the control logic is configured to control the peripheral circuit to perform the retention acceleration operation immediately after the program voltage applying operation is performed.

7. The semiconductor memory device of claim 1, wherein the control logic is configured to
control to perform program voltage applying operations and program verify operations on the selected memory block during the program operation, and
control the peripheral circuit to perform the retention acceleration operation based on the result of the program verify operation of the previous program loop being a program pass.

8. A semiconductor memory device, comprising:
a memory block including memory cells programmed to a plurality of program states;
a peripheral circuit configured to perform a program operation including a plurality of program loops for the memory block; and
control logic configured to control the peripheral circuit to perform the plurality of program loops, wherein the control logic is configured to control the peripheral circuits to perform a retention acceleration operation during a current program loop based on a result of a program verify operation of a previous program loop among the plurality of program loops being a program pass.

9. The semiconductor memory device of claim 8, wherein each of the plurality of program loops includes a program voltage applying operation and the program verify operation.

10. The semiconductor memory device of claim 9, wherein the peripheral circuit comprises:
a voltage generation circuit configured to generate, during the retention acceleration operation, a first set voltage to be applied to unselected word lines of the memory block, and a second set voltage to be applied to a selected word line of the memory block;
a row decoder configured to apply the first set voltage and the second set voltage to the unselected word lines and the selected word line of the memory block, respectively; and
a page buffer group configured to control a potential of bit lines of the memory block, or to sense the potential or a current amount of the bit lines.

11. The semiconductor memory device of claim 10, wherein the row decoder is configured to apply a turn-off voltage to a source select line and a drain select line of the memory block during the retention acceleration operation.

12. The semiconductor memory device of claim 11, wherein the row decoder is configured to control a channel of the plurality of cell strings in the memory block to have a floating state during the retention acceleration operation.

13. The semiconductor memory device of claim 12, wherein
the channel of the plurality of cell strings is boosted by the first set voltage, and
the first set voltage is higher than the second set voltage.

14. The semiconductor memory device of claim 9, wherein the control logic is configured to control the peripheral circuit to perform the retention acceleration operation immediately after the program voltage applying operation of the current program loop is performed or before the program voltage applying operation of the current program loop is performed.

15. The semiconductor memory device of claim 9, wherein the control logic is configured to control the peripheral circuits to perform the program verify operation performed after the retention acceleration operation, using a new verify voltage lower than a verify voltage used in a previous program verify operation.

16. A method of operating a semiconductor memory device, the method comprising:

performing a program voltage applying operation of applying a program voltage to a selected word line among a plurality of word lines connected to a cell string, the cell string including a plurality of memory cells programmed to a plurality of program states;

performing a program verify operation on memory cells connected to the selected word line; and performing a retention acceleration operation by boosting a channel of the cell string based on a result of the program verify operation being a program pass.

17. The method of claim 16, further comprising:

performing a next program voltage applying operation including applying a new program voltage to the selected word line before performing the retention acceleration operation.

18. The method of claim 16, wherein performing the retention acceleration operation comprises:

turning off a source select transistor and a drain select transistor of the cell string;

boosting a channel of the cell string by applying a first set voltage to unselected word lines among the plurality of word lines connected to the cell string; and applying a second set voltage lower than the first set voltage to the selected word line.

19. The method of claim 18, wherein the second set voltage is 0 V.

20. The method of claim 16, comprising:

performing another program voltage applying operation using a new program voltage obtained by increasing the program voltage based on the result of the program verify operation being a program fail.

* * * * *